United States Patent
Smolders et al.

(10) Patent No.: US 7,388,439 B2
(45) Date of Patent: Jun. 17, 2008

(54) LOW PASS FILTER AND ELECTRONIC DEVICE

(75) Inventors: Adrianus Bernardus Smolders, Nijmegen (NL); Nicolas Jonathan Pulsford, Nijmegen (NL); Adrianus Alphonsus Jozef Buijsman, Nijmegen (NL); Pascal Philippe, Caen (FR); Fattah Haddad, Nijmegen (NL)

(73) Assignee: NXP B.V., Eindhoven (NL)

( * ) Notice: Subject to any disclaimer, the term of this patent is extended or adjusted under 35 U.S.C. 154(b) by 207 days.

(21) Appl. No.: 10/558,718

(22) PCT Filed: May 26, 2004

(86) PCT No.: PCT/IB2004/050778

§ 371 (c)(1), (2), (4) Date: Nov. 29, 2005

(87) PCT Pub. No.: WO2004/107568

PCT Pub. Date: Dec. 9, 2004

(65) Prior Publication Data

US 2007/0018748 A1    Jan. 25, 2007

(30) Foreign Application Priority Data

Jun. 3, 2003 (EP) .................... 03076725

(51) Int. Cl.
*H03L 7/00* (2006.01)

(52) U.S. Cl. .............. 331/17; 331/108 C; 331/176; 331/36 C; 257/301; 257/774

(58) Field of Classification Search ........... 257/774, 257/301; 331/36 C, 108 C, 17
See application file for complete search history.

(56) References Cited

U.S. PATENT DOCUMENTS 6,700,203 B1 *  3/2004  Cabral et al. ............ 257/774
6,984,860 B2 *  1/2006  Grivna et al. ............ 257/301

* cited by examiner

*Primary Examiner*—Arnold Kinkead
(74) *Attorney, Agent, or Firm*—Peter Zawilski

(57) ABSTRACT

The electronic device (100) of the invention comprises a semiconductor device (30) and a low-pass filter (20), which are present in a stacked configuration, and which together include a phase locked loop. The low-pass filter is preferably embodied by vertical trench capacitors, and preferably comprises a drift compensation part. The device (100) can be suitably provided in an open loop architecture. In a preferred embodiment, the low-pass filter comprises a large capacitor (C2) and a small capacitor (C1) connected in parallel, the large capacitor (C2) being connected in series with a resistor (R1).

15 Claims, 3 Drawing Sheets

LOW PASS FILTER AND ELECTRONIC DEVICE

The invention relates to a low-pass filter comprising a large and a small capacitor which are connected in parallel, the large capacitor being connected in series with a resistor.

The invention also relates to an electronic device provided with a phase-locked loop function comprising a comparator, a low-pass filter and a voltage controlled oscillator, the comparator and the oscillator being part of a single semiconductor device and the low-pass filter being embodied by a small and a large capacitor.

Such an electronic device is commercially available as a Bluetooth module provided by Philips Semiconductors as BGB101A. Such a Bluetooth module comprises all high-frequency elements needed for the operation according to the Bluetooth protocol, including a transceiver, a power amplifier for amplifying the output signal to an antenna, a low-noise amplifier for amplifying an input signal from the antenna as well as necessary switches, matching functions and filters. The antenna may be part of the module, but can be provided separately as well.

The low-pass filter in this module is embodied by discrete capacitors and a discrete resistor. The small capacitor has a value of 2.2 nF and the large capacitor has a value of 22 nF. The filter forms a phase-locked loop (PLL) function together with the comparator and the oscillator. In the device, the loop gets an input signal via the comparator. This compares the input signal to a reference signal from the oscillator and sends its output to the low-pass filter. The output of the low-pass filter is used both as an output signal and as an input for the oscillator. The output of the oscillator is the reference signal used by the comparator.

The low-pass filter has two functions in this topology: it is a filter rejecting all high-frequency components. Moreover, it will assure that the frequency of the oscillator is maintained, when the device is in the sending mode. Hereto, it is of importance for the capacitors to be able to keep the specified frequency. For this purpose, capacitors that fulfill the NP0-standard are used in the known module. This standard prescribes that the capacitance varies less than 30 ppm/° C. over a temperature range between −30 and +85° C.

It is a disadvantage of the current solution that these capacitors are relatively large. It is desired to reduce the space of the module, so that it can be included more easily in all kinds of hand-held apparatus.

It is therefore a first object of the invention to provide a reduced-size low pass filter of the kind described in the opening paragraph.

It is a second object of the invention to provide an electronic device with the improved low-pass filter.

The first object is achieved in that the filter is embodied on the basis of a semiconductor substrate with a first surface, in which the small and the large capacitor are provided as vertical trench capacitors, the trenches extending to the first surface on which the resistor is provided. Experiments have shown that the drift of the low-pass filter according to the invention is within the specifications, both at −30° C., at room temperature and at +85° C. This enables the use of the filter in a so-called open loop architecture.

Vertical trench capacitors are known per se, for instance from Roozeboom et al., Int. J. Microcircuits and Electronic Packaging, 24 (2001), 182-196. There is, however, no teaching or suggestion that capacitors with different capacitances can be integrated in a single substrate together with desired resistors. It is not known either that in such a single substrate the leakage of the capacitors and the temperature stability are according to specifications.

In a preferred embodiment the semiconductor substrate further comprises a drift compensation part. Such a drift compensation part is suitably embodied as an RC-filter that is coupled to ground. It is connected in parallel to the filter. This may be embodied in that there is a separate connection—i.e. solder ball or bond wire—from the drift compensation part to the semiconductor device. The RC-filter is chosen such as to have the same period (time constant) as the drift which occurs in the open loop architecture.

The combination of low-pass filter and drift compensation part takes away the disadvantages of open loop modulation in that no more expensive discrete capacitors are needed. It furthermore has the advantage of an open-loop modulation that a very pure signal is provided without any spurious components as necessary in a closed-loop architecture.

In a further embodiment one end of the filter is connected to ground. This is an embodiment of the open loop architecture. It is preferred that both the drift compensation part and the filter are connected to ground, such that there is one connection to ground from the low-pass filter.

It is preferred that the small and the large capacitor are separated by a high-ohmic substrate zone with a resistance of at least 0.5 kΩ/cm. Herewith the leakage current can be reduced as desired. Preferably the substrate zone has a resistance of about 1.0 kΩ/cm. The substrate resistance is preferably increased by implantation, more preferably by implantation with Ar gas.

In another embodiment, the trench capacitors have a dielectric comprising silicon nitride. Such a dielectric does not show any hysteresis. It has been found preferable to use a stack of silicon oxide, silicon nitride and silicon oxide as the dielectric. Such stacks turn out to have excellent breakdown voltages.

In a further embodiment the resistor comprises a layer of polysilicon, in which layer the upper electrodes of the capacitors are defined as well. This is advantageous in view of processing.

In an even further embodiment, the semiconductor substrate further comprises diodes. Such diodes can be suitably embodied as a pn diode, a Zener diode, a back-to-back diode, a front-to-back diode or a floating diode. The diodes can very well be combined with the high-ohmic substrate in that only part of the substrate is made high-ohmic. This is also preferable for the etching of the vertical trench capacitors. The advantages of the integration of the diodes are at least twofold. First, the open loop architecture can be embodied in that the low-pass filter and the drift compensation part are each connected to diodes. A larger part of the phase locked looped function can thus be integrated in the semiconductor substrate. This allows that the number of connections between the filter and the semiconductor device is reduced. It furthermore allows for the available space to be used more efficiently, and hence for miniaturisation of the electronic device to be possible. A second advantage is that the semiconductor device can thus be more specifically designed for its functions of comparator and oscillator. It is for instance possible to use other substrate materials in which the diodes do not fit well.

The second object of the invention is achieved in that the low-pass filter according to claim 1 is present, which filter is assembled to the semiconductor device in a stacked die construction. Due to the stacked die construction, the space for the discrete capacitors is no longer needed. Surprisingly, it was found therewith that the presence of the filter on top of the semiconductor device does not influence any inductors implanted therein.

In a suitable embodiment the semiconductor device is provided with a first and an opposed second side, on which first side the low-pass filter is present and on which second side the semiconductor device can be coupled to a heat sink. The semiconductor device must dissipate more heat than the low-pass filter, and should thus be provided with a heat sink. This can be realized in two different manners; first of all, in that the semiconductor device is attached with its second side to a heat sink on a carrier, or on a leadframe. The filter is then provided as a component on the first side of the semiconductor device. The second embodiment is that the device is provided with a leadframe to which the semiconductor device is attached. The filter can then act as a support for the semiconductor device, and its surface can be provided with interconnects that are used for rerouting.

In a preferred embodiment the low-pass filter has lateral dimensions which are at most equal to that of the semiconductor device. In this embodiment, the low-pass filter will be a component on top of the semiconductor device. The connections between the filter and the semiconductor device can be realized both with wirebonding and with solder or metal bumps. In case bumps are used, the semiconductor device is preferably provided with a structure known as bond pads on active. Such presence of bond pads on top of areas in which transistors are defined requires a stabilisation of the interconnect structure of the semiconductor device. For instance, the bond pads may be provided as conducting tracks on top of the passivation layer. The use of bond pads on active allows the filter to be positioned on any location on the first side of the semiconductor device. It is preferred that the device is encapsulated after the filter has been assembled to the semiconductor device.

These and other aspects of the filter and the electronic device of the invention will be further explained with reference to the figures, in which.

Figure 1:
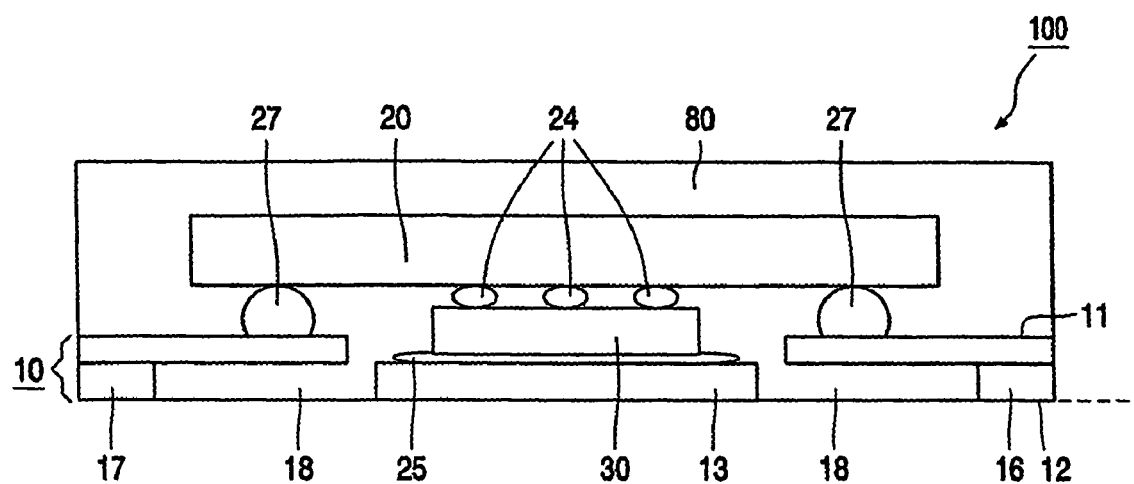
FIG. 1 shows a diagrammatical cross-section of a first embodiment of the device.

FIG. 1 shows a first embodiment of the electronic device 100 of the invention. It comprises the low-pass filter 20 and the semiconductor device 30. The semiconductor device comprises electrical functions not shown, which generally include a transceiver and an oscillator. However, the semiconductor device 30 can be limited to an oscillator and a comparator only. The semiconductor device 30 is provided on a heat sink 13 with a layer of electrically conducting glue or solder. It is electrically connected to the filter 20 via metal bumps 24. The filter 20 herein also acts as a carrier and comprises any interconnects that are necessary for rerouting purposes. Finally, it comprises the contacts to the leadframe 10 via solder bumps 27. The leadframe 10 shown here is a leadframe of the HVQFN-type (High Voltage Quad Flat Non-Leaded) having a first side 11 to which the filter 20 and the semiconductor device 30 are attached. It further has a second side 12, on which the contacts 16, 17 and the heatsink 13 are exposed. The leadframe is half-etched from the second side 12, leading to spaces 18, which are filled with encapsulating, electrically insulating material and from part of the encapsulation 80.

Figure 2:
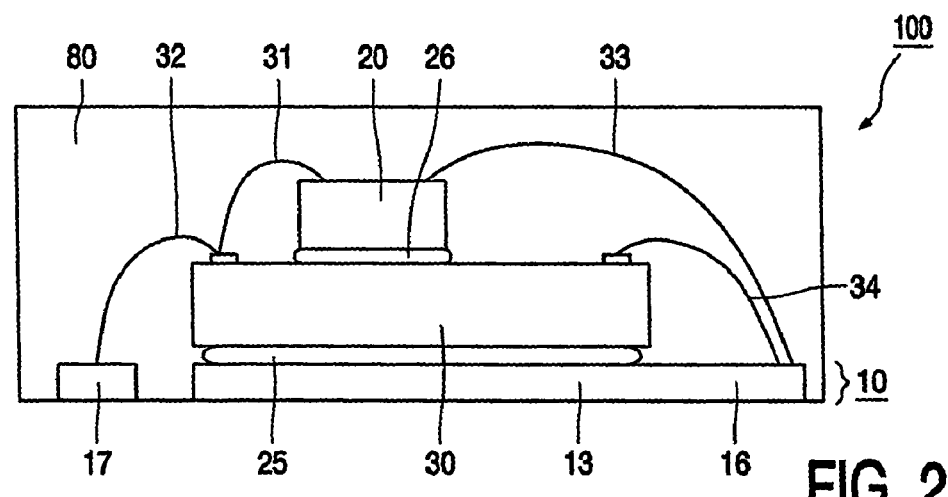
FIG. 2 shows a diagrammatical cross-section of a second embodiment of the device.
Figure 3:
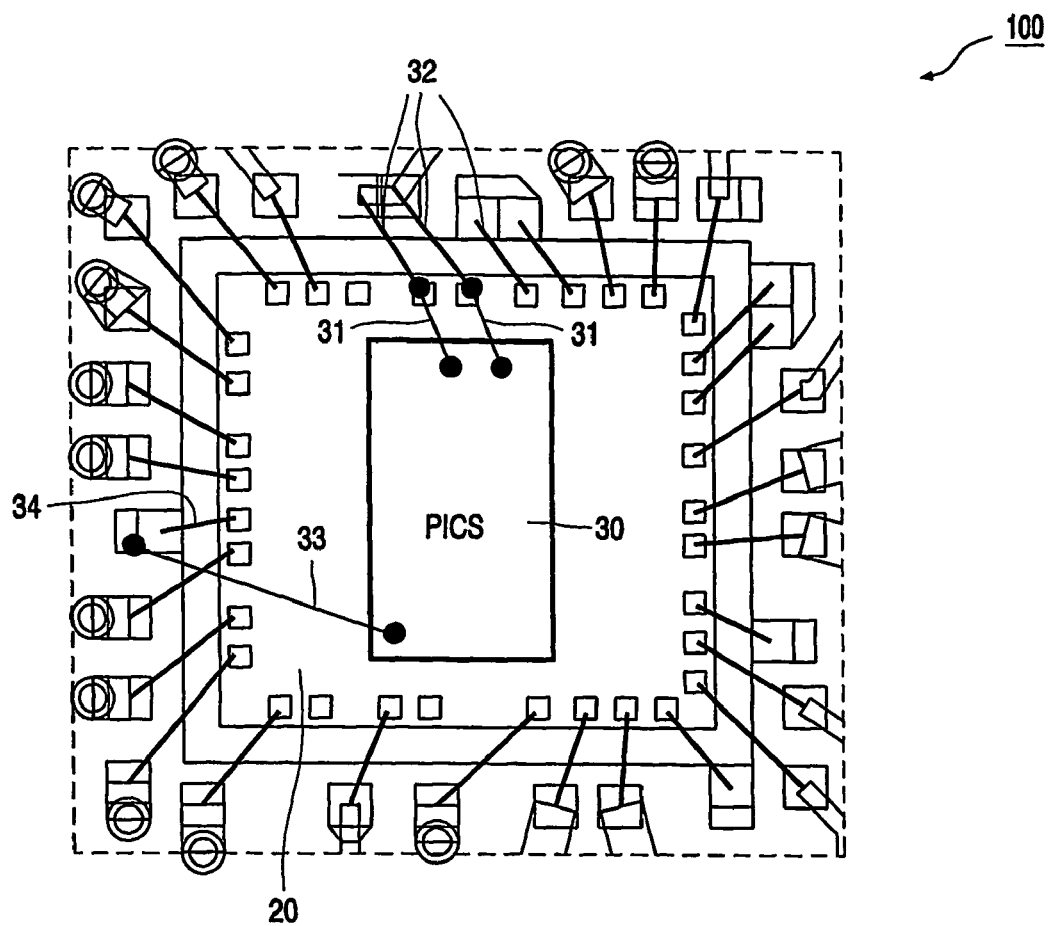
FIG. 3 shows a diagrammatical top view of the second embodiment

FIGS. 2 and 3 show a second, preferred embodiment of the electronic device 100 of the invention. FIG. 2 shows a diagrammatical cross-sectional view and FIG. 3 shows a top view. According to this embodiment, the filter 20 is positioned on top of the semiconductor device 30 and is attached thereto by a layer of non-conductive adhesive 26. The semiconductor device is here too provided on a heatsink 13, which is part of a leadframe 10. In this embodiment, the heatsink 13 also acts as a ground plane. The electrical connections between the filter 20, the semiconductor device 30 and the leadframe 10 are realized with wirebonds 31-34. Wirebonds 31 connect the filter 20 to the semiconductor device 30. Wirebonds 32 connect the semiconductor device 30 to the contact 17 at the leadframe 10. These connections 31,32 carry signals. The wirebonds 33,34 are connections to ground 16. Although wirebonds are preferable in view of the ease of application, a flip-chipped connection with metal/or solder balls, or a connection wherein both wirebonding and flip chip are used, can be used alternatively. The connection 33 of the filter 20 to ground is particularly suitable for an open-loop architecture. It is understood that the specific lateral position of the filter on the semiconductor device 30 is a matter of implementation.

Figure 4:
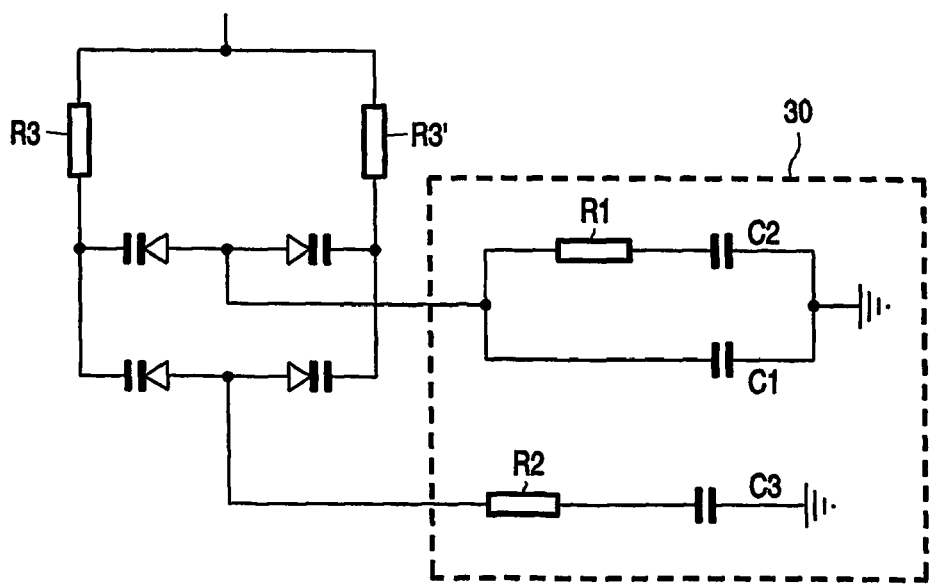
FIG. 4 shows an electrical diagram corresponding to the invention

FIG. 4 shows an electrical diagram that is used in the preferred embodiment. In this embodiment, the filter does not only comprise a small capacitor C1 and a large capacitor C2, which is connected in series with a resistor R1, but also a drift compensation part. This drift compensation part comprises a capacitor C3 and a resistor R2. The small capacitor C1 has a value of 2.2 nF and the large capacitor C2 has a capacitance of 22 nF. The capacitor C3 has a value of 5.6 nF. These values are used for an oscillator that acts at the frequency of the Bluetooth protocol, that is 2.4 GHz. It will be clear that other capacitances can be chosen for other frequency bands. Furthermore, in the present example the filter is designed to operate at a single frequency only. It can be extended, however, to include the elements for more frequency bands as well.

FIG. 4 furthermore shows the coupling of the drift compensation part and the filter to the circuitry. At the one end, both the filter and the compensation part are coupled to ground. This is embodied in the example shown in FIGS. 2 and 3 in a combined connection to ground. At the same time, the drift compensation part and the filter are connected in parallel. Each of them is thus present between diodes. The circuit part is furthermore provided with resistors R3 and R3'. The diodes and the resistors can be integrated in the filter 20 if so desired.

Experiments have shown that the present filter has the desired properties to act as a low-pass filter. The experiments have been done at different temperatures, at different frequencies and for hopping modes at different frequencies, and at different tuning voltages.

| Frequency GHz | temperature | 2.402 | 2.441 | 2.478 |
|---|---|---|---|---|
| DH1 (kHz) | 25° C. | −17 | −16 | −18 |
| DH5 (kHz) | 25° C. | −29 | −26 | −30 |

If the frequency is set to hopping mode, an average drift of −15 kHz for DH1 and −26 kHz for DH5 is found.

| Frequency GHz | temperature | 2.402 | 2.441 | 2.478 |
|---|---|---|---|---|
| DH1 (kHz) | 85° C. | −10 | −19 | −19 |
| DH5 (kHz) | 85° C. | 26 | −25 | −32 |

In the hopping mode an average drift of −12 kHz for DH1 and −25 kHz for DH5 is observed.

| Frequency GHz | temperature | 2.402 | 2.441 | 2.478 |
|---|---|---|---|---|
| DH1 (kHz) | −30° C. | 15 | 13 | 15 |
| DH5 (kHz) | −30° C. | 40 | 17 | −28 |

In the frequency hopping mode an average drift is found of 19 kHz for DH1 and 42 kHz for DH5. An optimal value can be achieved by tuning the transceiver.

Further measurements were done in a static environment in order to check the level of the tuning voltage $V_{tune}$. This was done in view of the semiconductor device 30 comprising a coil, and the filter 20 being present on top thereof. The coil is used in the voltage controlled oscillator.

At a tuning voltage level $V_{tune}$ of 3 volts and of 2.7 volts the following was observed:

| Frequency GHz | 2.402 | 2.441 | 2.478 |
|---|---|---|---|
| Vtune (V) | 1.4 | 1.64 | 1.94 |
| DH5 (kHz) | −25 | −20 | −16 |

As is apparent from this, the differences of the tuning voltage level do not affect the data found. It can thus be concluded that the tuning voltage is not affected by the specific location of the filter 20 on top of the semiconductor device 20.

Figure 5:
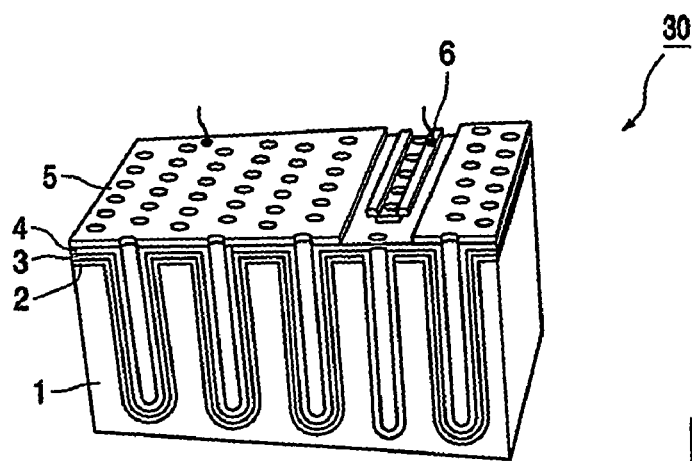
FIG. 5 shows a birds' eye perspective view of a prototype of the filter of the invention.

FIG. 5 shows a bird's eye perspective view of a prototype of the filter according to the invention. In fact, the prototype shown is an array of trench capacitors. These capacitors are provided in a semiconductor substrate 1 of Si. The lower electrode 2 comprises an n$^+$ doped zone in the substrate 1. Thereon a dielectric 3, actually of silicon nitride, is provided. The top electrode 4 is realized in polysilicon, which is n$^+$-doped. On top of this a metal layer is provided in which the contacts for the top electrode 5 and for the lower electrode 6 are defined. The pores in the substrate 1 have a diameter in the order of 1 μm and a depth of about 20 μm. The capacitance of the capacitors is defined by the number of pores. Between the capacitors the substrate is made high-ohmic. This provides a barrier between leakage between the individual capacitors C1, C2, C3. If desired, resistors can be defined on the surface of the substrate, for instance in the same layer of polysilicon as the top electrode 4 is defined in. If desired, planar capacitors can be defined on the surface of the substrate. If desired, inductors can be defined in the metal layer used for the contacts 5, 6. The pores can be grown by dry-etching or wet-chemical etching, such as known from Roozeboom et al., *Int. Journal of Microcircuits and Electronic Packaging*, 24 (2001), 182-196.

Figure 6:
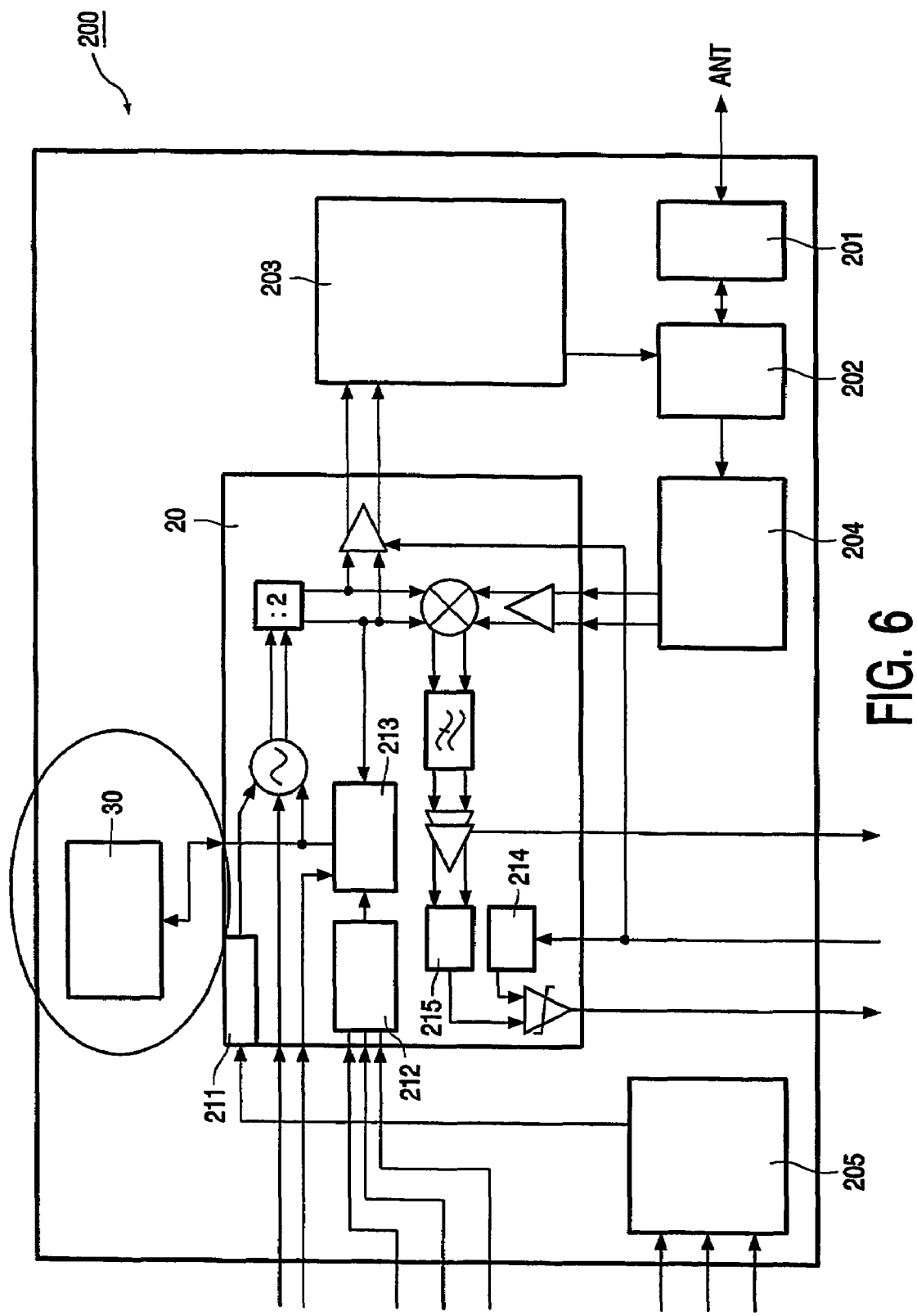
FIG. 6 shows a schematic drawing of an application of the present device. The figures are not drawn to scale and like reference numbers refer to like parts.

FIG. 6 shows the architecture of an application of the electronic device 100 of the invention. In fact, this application is a front-end radio module 200 suitable for processing signals according to the Bluetooth protocol. The module 200 comprises the semiconductor device 30 and the filter 20. The semiconductor device 30 contains in this case both the voltage controlled oscillator and the transceiver and the power and low-noise amplifier (shown as triangles in the figure). The transceiver part comprises the functions of the regulator 211, the control logic 212, the synthesizer 213, the DC extractor 214 and the demodulator 215. In addition to the semiconductor device 30 and the filter, the module 200 comprises a supply decoupling 205, with the supply voltages and ground as inputs. The module 200 further comprises a transmit path in which a balun and filter 203 are present; a receive path in which a balun and filter 204 are present; a switch 202 between the transmitting and the receiving paths, and a band-pass filter 201.

The invention claimed is:

1. A low-pass filter comprising a large and a small capacitor which are connected in parallel, the large capacitor being connected in series with a resistor, characterized in that the filter is embodied on the basis of a semiconductor substrate with a first surface, in which the small and the large capacitor are each provided as a single vertical trench capacitor, the trenches extending to the first surface on which the resistor is provided and further characterized in that the semiconductor substrate further comprises a drift compensation part.

2. A low-pass filter comprising a large and a small capacitor which are connected in parallel, the large capacitor being connected in series with a resistor, characterized in that the filter is embodied on the basis of a semiconductor substrate with a first surface, in which the small and the large capacitor are each provided as a single vertical trench capacitor, the trenches extending to the first surface on which the resistor is provided and further characterized in that the small and the large capacitor are separated by a high-ohmic substrate zone with a resistance of at least 0.5 kΩ/cm wherein the high-ohmic substrate zone is situation to mitigate leakage.

3. A low-pass filter as claimed in claim 1, characterized in that the trench capacitors have a dielectric comprising silicon nitride.

4. A low-pass filter as claimed in claim 1, characterized in that the resistor comprises a layer of polysilicon, in which layer the upper electrodes of the capacitors are defined as well.

5. A low-pass filter as claimed in claim 1, characterized in that the semiconductor substrate further comprises diodes.

6. An electronic device, comprising: a phase locked loop function including a comparator, a low-pass filter and a voltage controlled oscillator, the comparator and the oscillator being part of a single semiconductor device and the low-pass filter including a large and a small capacitor that are connected in parallel, the large capacitor being connected in series with a resistor, wherein the low-pass filter is embodied on the basis of a semiconductor substrate with a first surface, in which the small and the large capacitor are each provided as a single vertical trench capacitor, the trenches extending to the first surface on which the resistor is provided and the low-pass filter being assembled to the semiconductor device in a stacked die construction, and wherein the semiconductor device is provided with a first and an opposed second side, at which first side the low-pass filter is present and at which second side the semiconductor device can be coupled to a heat sink.

7. An electronic device comprising: a phase locked loop function including a comparator, a low-pass filter and a voltage controlled oscillator, the comparator and the oscillator being part of a single semiconductor device and the low-pass filter including a large and a small capacitor that are connected in parallel, the large capacitor being connected in series with a resistor, wherein the low-pass filter is embodied on the basis of a semiconductor substrate with a first surface, in which the small and the large capacitor are each provided as a single vertical trench capacitor, the trenches extending to the first surface on which the resistor is provided and the low-pass filter being assembled to the semiconductor device in a stacked die construction, and wherein the low-pass filter has lateral dimensions which are at most equal to those of the semiconductor device.

8. An electronic device comprising: a phase locked loop function including a comparator, a low-pass filter and a voltage controlled oscillator, the comparator and the oscillator being part of a single semiconductor device and the low-pass filter including a large and a small capacitor that are connected in parallel, the large capacitor being connected in series with a resistor, wherein the low-pass filter is embodied on the basis of a semiconductor substrate with a first surface, in which the small and the large capacitor are each provided as a single vertical trench capacitor, the trenches extending to the first surface on which the resistor is provided and the low-pass filter being assembled to the semiconductor device in a stacked die construction, and the phase locked loop being provided in an open loop architecture.

9. A low-pass filter comprising a large and a small capacitor which are connected in parallel, the large capacitor being connected in series with a resistor, characterized in that the filter is embodied on the basis of a semiconductor substrate with a first surface, in which the small and the large capacitor are provided as vertical trench capacitors, the trenches extending to the first surface on which the resistor is provided, and characterized in that the small capacitor and the large capacitor are separated by a high-ohmic substrate zone with a resistance of at least 0.5 k$\Omega$/cm.

10. A low-pass filter as claimed in claim 9, characterized in that the semiconductor substrate further includes a drift compensation part.

11. A low-pass filter as claimed in claim 9, characterized in that one end of the filter is connected to ground.

12. A low-pass filter as claimed in claim 9, characterized in that the trench capacitors have a dielectric that includes silicon nitride.

13. A low-pass filter as claimed in claim 9, characterized in that the resistor includes a layer of polysilicon, and upper electrodes of the large and small capacitors are defined in the layer of polysilicon.

14. A low-pass filter as claimed in claim 9, characterized in that the semiconductor substrate further includes diodes.

15. A low-pass filter as claimed in claim 9, wherein a capacitance of the large capacitor is approximately ten times larger than a capacitance of the small capacitor.

* * * * *